(12) United States Patent
Matsui et al.

(10) Patent No.: US 6,700,122 B2
(45) Date of Patent: Mar. 2, 2004

(54) WAFER INSPECTION SYSTEM AND WAFER INSPECTION PROCESS USING CHARGED PARTICLE BEAM

(75) Inventors: Miyako Matsui, Kokubunji (JP); Mari Nozoe, Hino (JP); Atsuko Takafuji, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/035,150

(22) Filed: Jan. 4, 2002

(65) Prior Publication Data

US 2002/0134936 A1 Sep. 26, 2002

(30) Foreign Application Priority Data

Mar. 23, 2001 (JP) .......................................... 2001-084232

(51) Int. Cl.[7] .............................................. G01R 31/26
(52) U.S. Cl. .................... 250/310; 250/310; 250/492.2; 324/71.3; 324/765
(58) Field of Search .................... 324/71.3; 250/310, 250/492.2

(56) References Cited

U.S. PATENT DOCUMENTS 6,232,787 B1 * 5/2001 Lo et al. ...................... 324/751
6,504,393 B1 * 1/2003 Lo et al. ...................... 324/765

* cited by examiner

Primary Examiner—John R. Lee
Assistant Examiner—James J. Leybourne
(74) Attorney, Agent, or Firm—Antonelli, Terry, Stout & Kraus, LLP

(57) ABSTRACT

The present invention provides a wafer inspection technique capable of detecting a defect in a wafer on which a pattern having a large step such as a contact hole being subjected to a semiconductor manufacturing process is formed and obtaining information such as the position and kind of a defect such as a hole with open contact failure caused in dry etching process at high speed. A wafer on which a pattern having a large step being subjected to a semiconductor manufacturing process is formed is scanned and irradiated with an electron beam having irradiation energy which is in a range from 100 eV to 1,000 eV, and a defect is detected at high speed from an image of secondary electrons generated. Before the secondary electron image is captured, the wafer is irradiated with an electron beam at high speed while being moved to thereby charge the surface of the wafer with a desired charging voltage. The kind of the defect is determined from the captured secondary electron image, and a distribution of defects in the plane of the wafer is displayed.

12 Claims, 11 Drawing Sheets

VOLTAGE OF THE ENERGY FILTER (V)

FIG.9A
FIG.9B
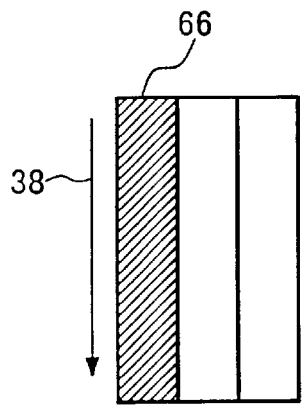
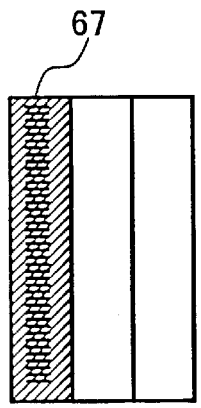
FIG.9C
FIG.9D
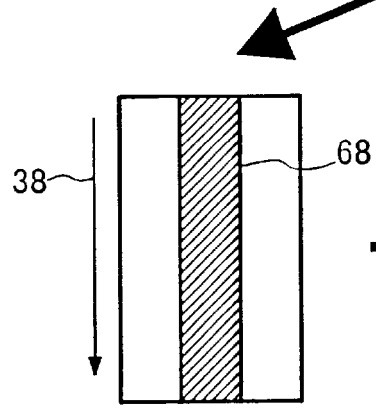
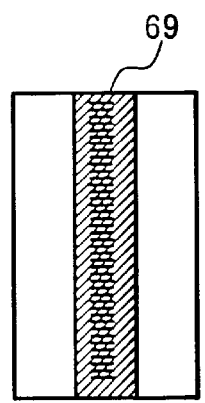
FIG.9E
FIG.9F
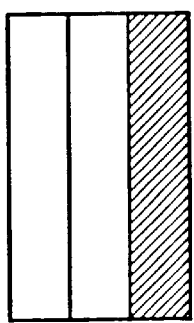
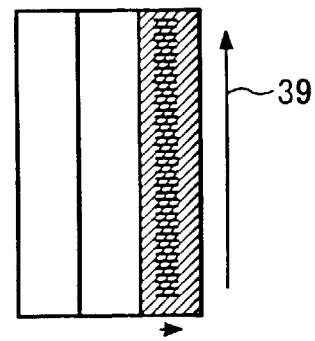

THICKNESS OF THE RESIDUAL FILM (nm)

WAFER INSPECTION SYSTEM AND WAFER INSPECTION PROCESS USING CHARGED PARTICLE BEAM

BACKGROUND OF THE INVENTION

The present invention relates to a wafer inspection technique using a charged particle beam and, more particularly, to an inspection technique using a charged particle beam such as an electron beam for detecting a foreign matter or a defect on a wafer such as a semiconductor wafer having a fine circuit pattern.

As a method of evaluating a semiconductor waver having a fine circuit pattern with an electron beam, a technique of conducting a higher-precision inspection of higher throughput adapted to the larger diameter of a wafer and a finer circuit pattern is being practically used. For example, as disclosed in Japanese Patent Application Laid-Open No. H06-139985, a method of conducting an inspection for a defect by using contrast of a secondary electron beam generated due to surface potential variations is known.

In a method of detecting an electric defect from voltage contrast, an electron beam is emitted before an inspection to preliminarily positively or negatively charge the surface of a wafer, and a secondary electron image is acquired, thereby enabling voltage contrast to be increased. An example of a method of positively charging the surface of a wafer is disclosed in Japanese Patent Application Laid-Open No. 2000-208085, where a pattern such as a contact hole in which a plug is buried is inspected by irradiating the surface of a wafer with an electron beam to positively charge the surface and, after that, voltage contrast is obtained.

Although the method of conducting an inspection on a circuit in which a plug is buried is described in the above publications, a method of conducting an inspection on the bottom of a pattern having very a large step such as a hole after dry etching is not described.

On the other hand, a technique of observing the bottom of a hole pattern from an image of secondary electrons discharged when the hole pattern is irradiated with an electron beam is known. By conventional scanning electron microscopes, however, it takes time to observe an object in a limited field of view at a high scaling factor. It is therefore impossible to observe the entire surface of a wafer and detect a defect.

An example of an inspection method of negatively charging the surface of a wafer and detecting a contact hole with an open contact failure is disclosed in the above-described Japanese Patent Application Laid-open No. H06-139985 in which the surface of a wafer is negatively charged by being irradiated with an electron beam with low energy and, after that, a secondary electron image is obtained. In the method, by using the fact that when a residual film exists on the bottom of a hole, the potential of the opening is changed by the residual film, and the diameter of the hole becomes seemingly small, a hole with an open contact failure is detected.

According to the method, however, an object in a limited field of view is observed at a high scaling factor over long time, and it is impossible to observe the entire surface of a wafer to detect a defect. Since an electron beam is preliminarily emitted to negatively charge the surface of a wafer and, after that, a secondary electron image is captured and further, since irradiation electron energy used to negatively charge the surface of a wafer and that used to acquire a secondary electron image are largely different from each other, it is difficult to set an electron beam optics unit and an inspection cannot be efficiently conducted on the entire surface of a wafer. Since the wafer has to be irradiated with an electron beam twice or more, the whole surface of a wafer cannot be efficiently inspected.

A conventional inspection system using an electron beam has problems as described below.

In a conventional inspection system using an electron beam, a defect is detected from contrast obtained due to potential variations which occur on a wafer having a circuit pattern. However, it is difficult to detect the state of the bottom of a pattern having a large step, such as a contact hole with an open contact failure, with high sensitivity by detecting a secondary electron signal from the bottom portion of the pattern. Particularly, most of secondary electrons from the bottom of a hole pattern having a high aspect ratio are hindered by side walls and cannot be detected. It is therefore difficult to detect a hole pattern with an open contact failure.

By a conventional scanning electron microscope, although the shape of the bottom of a hole pattern and a foreign matter can be detected, it is difficult to detect, for example, a hole having an open contact failure. By the conventional scanning electron microscope, observation is made at high a scaling factor with high spatial resolution. Consequently, scan speed is low, the scan range is narrow, and it is impossible to scan a large area such as a wafer required for a defect detector at high speed.

In the method of negatively charging the surface of a wafer and detecting a contact hole with an open contact failure, the electron beam accelerated to low speed is emitted to negatively charge the surface of the wafer and, after that, a secondary electron image is captured. However, in the method, due to a large difference between the energy of the electron beam emitted to negatively charge the surface of the wafer and that of the electron beam emitted to obtain a secondary electron image, it is difficult to emit the electron beams by using the same electron source. Further, the electron beam is emitted once to negatively charge the surface of the wafer and, after that, the secondary electron image is observed at a high scaling factor with high spatial resolution. Consequently, the scan speed is low, the scan range is narrow, and it is impossible to scan a large area such as a wafer at high speed required for the defect detector. Thus, the entire surface of a wafer cannot be efficiently inspected.

Further, in the conventional apparatuses, the surface of a wafer is negatively charged and the opening is evaluated. Consequently, according to the kind and material of a semiconductor circuit pattern, the kind of a semiconductor device which can be evaluated is limited. There is a problem such that sensitivity of detection of a hole with a contact hole failure varies according to the kind of a circuit pattern.

SUMMARY OF THE INVENTION

It is therefore an object of the invention to provide, as a technique solving the problems, of conducting an inspection of a wafer being subjected to a semiconductor manufacturing process, a wafer inspection system and a wafer inspection process for inspecting a pattern having a large step such as a hole pattern for a defect at high speed and with high precision. Another object of the invention is to provide a technique contributing optimization of a semiconductor manufacturing process by using defect information such as an open contact failure of a hole. Further another object of the invention is to provide a technique contributing to increase reliability of a semiconductor device by detecting an abnormal process at an early stage and taking a measure in the control of a semiconductor manufacturing process.

First, the method of carrying out an inspection by positively charging the surface of a wafer will be described. The principle of the invention in which a secondary electron emitted from the bottom of a hole is detected will be described by referring to FIGS. 2A and 2B.

An image of a hole pattern is captured by a conventional inspection system using an electron beam. For example, when the irradiation energy of the electron beam is 500 eV (electron volts) and the aspect ratio is 4 or less, secondary electrons 34 exhausted from the bottom of a hole are easily detected. An open hole is observed light and a hole with an open contact failure is observed dark. However, when the aspect ratio is high, as shown in FIG. 2A, most of the secondary electrons 34 from the bottom of the hole are interrupted by side walls 35. Consequently, the open hole is also observed dark, so that a hole with an open contact failure cannot be detected.

To deal with the problem, means for preliminarily irradiating the surface of a wafer with an electron beam or the like to charge the surface 36 of the wafer to a desired voltage before capturing a secondary electron image used for inspection is provided. As shown in FIG. 2B, when the surface 36 of the wafer 36 is positively charged, a part of the secondary electrons 34 emitted from the bottom of the hole is accelerated upward and can be efficiently detected. Further, the secondary electrons 34 emitted from the bottom of the hole can be accelerated. Therefore, when the secondary electron 34 emitted from the bottom of the hole collides with the sidewall 35 of the hole, a secondary electron is further emitted from the side wall 35. A part 37 of the secondary electrons emitted from the side wall 35 is accelerated toward the opening and can be detected by a detector. As a result, the secondary electrons 35 emitted from the bottom of a hole of high aspect ratio can be pulled out and detected, and information such that the hole is open or has an open contact failure can be obtained. At this time, according to the voltage for charging the surface 36, the aspect ratio and the hole diameter by which the hole can be detected are determined. Therefore, means for controlling the surface 36 of a wafer to a desired charging voltage is provided.

The voltage of charging the surface 36 of a wafer at the time of detecting whether a hole having a high aspect ratio is open or has an open contact failure is determined by the aspect ratio, hole diameter, and kind and thickness of an insulating film around the hole. For example, to detect whether a hole having an aspect ratio of 10 formed in a silicon oxide film is open or has an open contact failure, it is necessary to charge the surface 36 of the wafer to 5 V or higher. Therefore, means for determining a charging voltage with reference to a prestored database is provided. In the invention, for a hole pattern having a step, it is desirable to set the charging voltage of a wafer in a range from 5 V to 50 V.

A method of charging the surface 36 of a wafer to a desired positive voltage will now be described. When the surface of a wafer is a silicon oxide film or a insulating film made of an organic material, as an electron beam 38 for charging, an electron beam is emitted with irradiation energy in the range from 100 eV to 1000 eV so that secondary electron discharge efficiency becomes 1 or higher. An electron beam optics unit for charging a wafer can be also used as an electron beam optics unit used to capture an inspection image. Also, means for controlling the voltage for charging the surface 36 of the wafer by applying an optimum voltage to an electrode 32 mounted on the top face of the wafer and generating an electric field on the top face of the wafer is provided.

To inspect a large area of a wafer or the like at high speed, as the electron beam 38 for charging a wafer, an electron beam having spatial resolution which is lowered as compared with that for capturing an image can be used. Further, means is provided for efficiently positively charging the surface 36 of a wafer and conducting an inspection during movement of the wafer, which is realized by, as a method of scanning the electron beam 38 for charging a wafer, dividing the wafer into a plurality of inspection areas and alternately performing charging of the wafer and capturing of a secondary electron image.

A method of inspecting a hole by using the negative charging will now be described. The principle of detecting a defect by using the negative charging will be described with reference to FIGS. 3A to 3C. When the surface of a wafer is negatively charged, as shown in FIG. 3A, open holes 40 are observed darker than an oxide film surrounding the holes. In the case of the hole with an open contact failure, an oxide film 41 residing on the bottom is negatively charged. A potential distribution in an open hole shown in FIG. 3B and that in the hole with an open contact failure shown in FIG. 3C are different from each other. In the open hole, due to a large difference between the negative charging voltage on the bottom of the hole and that on the surface 36, a secondary electron emitted from the bottom of the hole does not easily go out from the hole. On the other hand, the bottom of the hole 41 with an open contact failure is negatively charged, so that secondary electrons emitted on the bottom of a hole are detected more easily than the open hole. The closer the distance to the outer periphery of the hole is, the higher the signal intensity of a secondary electron to be detected is. As shown in FIG. 3A, the secondary electron image of the hole 41 with an open contact failure is observed in such a manner that the signal intensity of the peripheral portion of the hole 41 is higher than that of the open hole 40 and the diameter of the hole 41 is smaller than that of the open hole 40. In the case where a contact hole 42 is tapered, the diameter of the contact hole 42 is observed larger than that of the open hole 40.

At this time, by the voltage for charging the surface, the aspect ratio at which the inspection can be conducted and the thickness of a residual film on the bottom which can be detected are determined. Consequently, means for controlling the surface to a desired negative charging voltage and means for detecting the difference in dimensions of holes in a secondary electron image are provided.

In the case of charging the surface of a wafer to a desired negative voltage, when the surface of the wafer is a silicon oxide film or an insulating film made of an organic material, an electron beam having an electron beam irradiation energy of 1,000 eV or higher with which the secondary electron emission efficiency is lowered is emitted. Means for passing a heavy current sufficient to negatively charge the surface of a wafer by using an electron source for capturing an image is provided. Further, means for applying an optimum voltage to the electrode 32 mounted on the top face of a wafer to efficiently negatively charging the surface of the wafer is also provided. By the electric field generated on the top face of the wafer, the secondary electrons emitted from the surface of the wafer can be efficiently returned to the surface of the wafer. Thus, the surface of the wafer can be charged to a desired negative voltage by using the electron source for capturing an image.

As described above, by adjusting the irradiation energy of the electron beam and the voltage of the electrode 32 mounted on the top face of the wafer 36, the surface 36 of the wafer can be controlled to an arbitrary positive or negative charging voltage by the single device. As a result, irrespective of the circuit pattern and the material of a semiconductor device, various semiconductor circuits can be inspected at high speed.

A method of controlling the voltage for charging the wafer to a desired positive or negative voltage will now be described. A wafer is moved to a chip for adjusting irradiation parameters, scanned and irradiated with an electron beam for charging, and scanned and irradiated with an electron beam for capturing an image, and a secondary electron image is captured. At the time of capturing a secondary electron image, secondary electrons are detected by using an energy filter 13. As the energy filter 13, an energy filter for detecting secondary electrons equal to or higher a threshold or equal to or lower than a threshold can be used.

In the case of capturing an image by using the energy filter for detecting secondary electrons equal to or higher than a threshold, means is provided for automatically measuring the voltage for charging the surface of a wafer by repeating operations of fixing a filter voltage of the energy filter 13, capturing a secondary electron image, after that, moving the wafer to a position where precharging is performed and a secondary electron image is captured, fixing the threshold of the energy filter at the second value, and capturing a secondary electron image.

As another method of measuring the charging voltage, a secondary electron image is captured while scanning a filter voltage of the energy filter 13 and measuring the charging voltage from the captured secondary electron image. Means for measuring the charging voltage by using the methods and optimizing the energy of the electron beam for charging, the beam current, and the electrode voltage so that the surface of a wafer is charged with a desired charging voltage is provided. Further, means for optimizing the irradiation parameters of an electron beam emitted to capture a secondary electron image is provided.

After adjusting the electron beam for charging and the electron beam for capturing a secondary electron image, an inspection is actually conducted. In the case of capturing a secondary electron image at the time of an inspection, a secondary electron image can be usually captured without using the energy filter 13. However, means for capturing a secondary electron image by using the energy filter 13 in specific cases is provided. Means for optimizing the set value of the energy filter from the secondary electron image captured at the time of measuring the charging voltage is provided. By filtering the secondary electron energy and capturing an image, a defect can be detected with high sensitivity.

A mechanism for capturing a secondary electron image by using the above methods, comparing the captured secondary electron image with a secondary electron image of the same pattern captured in another area on the wafer, and thereby detecting a defect is provided. Further, a mechanism of calculating the contrast and size of a hole is provided, and a mechanism of automatically determining the kind of a defect from the contrast and size of a hole with an open contact failure is provided. Further, means for displaying a result of determination of a defect and a distribution of defects in the plane of a wafer is provided.

First, a method of detecting a defect from a secondary electron image captured by positively charging the surface of a wafer will be described. In the case where the surface of a wafer is positively charged, a secondary electron image of an open hole is observed light. In the case of a hole with an open contact failure, the oxide film residing on the bottom is charged, so that the hole is observed darker than the open hole. In the case where the contact hole is tapered, the hole is observed light and large. Means for automatically detecting a hole with an open contact failure from variations in the contrast and hole diameter and determining the kind of the defect is provided. The thicker the oxide film residing on the bottom is, the darker the hole with the open contact failure is observed. Means for calculating the thickness of the film remaining on the bottom on the basis of brightness of the hole with an open contact failure is provided.

On the other hand, a method of positively charging the surface of a wafer and detecting a short circuit of a semiconductor circuit is provided. According to the invention, the surface of a wafer is positively charged and a hole with an open contact failure can be detected. As a result, both a short circuit of a semiconductor circuit and a hole with an open contact failure can be detected by the same system.

Next, a method of detecting a failure in the case of a material of the surface of a wafer which is not easily positively charged like a polysilicon mask, or in the case where the material of the bottom of the hole does not conduct a current unlike an insulating film will be described. When the surface of such a wafer is positively charged, a secondary electron image of an open contact failure is observed dark. Since the electric field in the opening in the case of a hole with an open contact failure and that in the case of an open hole are different from each other, the hole with an open contact failure is observed darker than the open hole. Consequently, means for determining the hole with the open contact failure on the basis of the size of the hole and automatically determining the kind of the defect is provided. Means for calculating the thickness of a film residing on the bottom from the size of the hole with an open contact failure is provided.

Further, a method of determining a defect from a secondary electron image captured at the time of negatively charging the surface of a wafer will be described. In the case of negatively charging the surface of a wafer, an open hole is observed dark in a secondary electron image. In the case of a hole with an open contact failure, the oxide film residing on the bottom is charged and the electric field of the opening changes, so that the hole is observed smaller than an open hole. When a contact hole is tapered, it is observed larger than the open hole. Consequently, means for detecting a hole with an open contact failure on the basis of the size of the hole and automatically determining the kind of the defect is provided. Means for calculating the thickness of the film residing on the bottom from the size of the hole with the open contact failure is provided.

As a result, whether or not there is a defect such as a hole with an open contact failure in a hole pattern can be determined at high speed. Further, a mechanism of finely adjusting manufacturing parameters in a semiconductor device manufacturing process from the detected defect information is provided. By the mechanism, the factor of occurrence of the defect can be estimated from the kind of the defect and a wafer in-plane distribution, and the parameters of manufacturing a semiconductor device can be finely adjusted. Further, a mechanism of adding a process of reducing defects in a semiconductor device on the basis of the detected defect information to a semiconductor manufacturing process is provided. Consequently, the semiconductor manufacturing process can be optimized at an early stage from the obtained defect information such as a hole with an open contact failure. An abnormal process can be found from the kind of the wafer and the distribution of defects in the plane of the wafer at an early stage, the factor of occurrence of the defect can be estimated at an early stage, and the reliability of the semiconductor device can be increased.

BRIEF DESCRIPTION OF THE DRAWINGS

FIGS. 9A to 9F are diagrams for explaining an example of the beam scan method.

DETAILED DESCRIPTION OF THE PREFERRED EMBODIMENTS

Embodiments of the invention will be described hereinbelow with reference to the drawings.

First Embodiment

Figure 1:
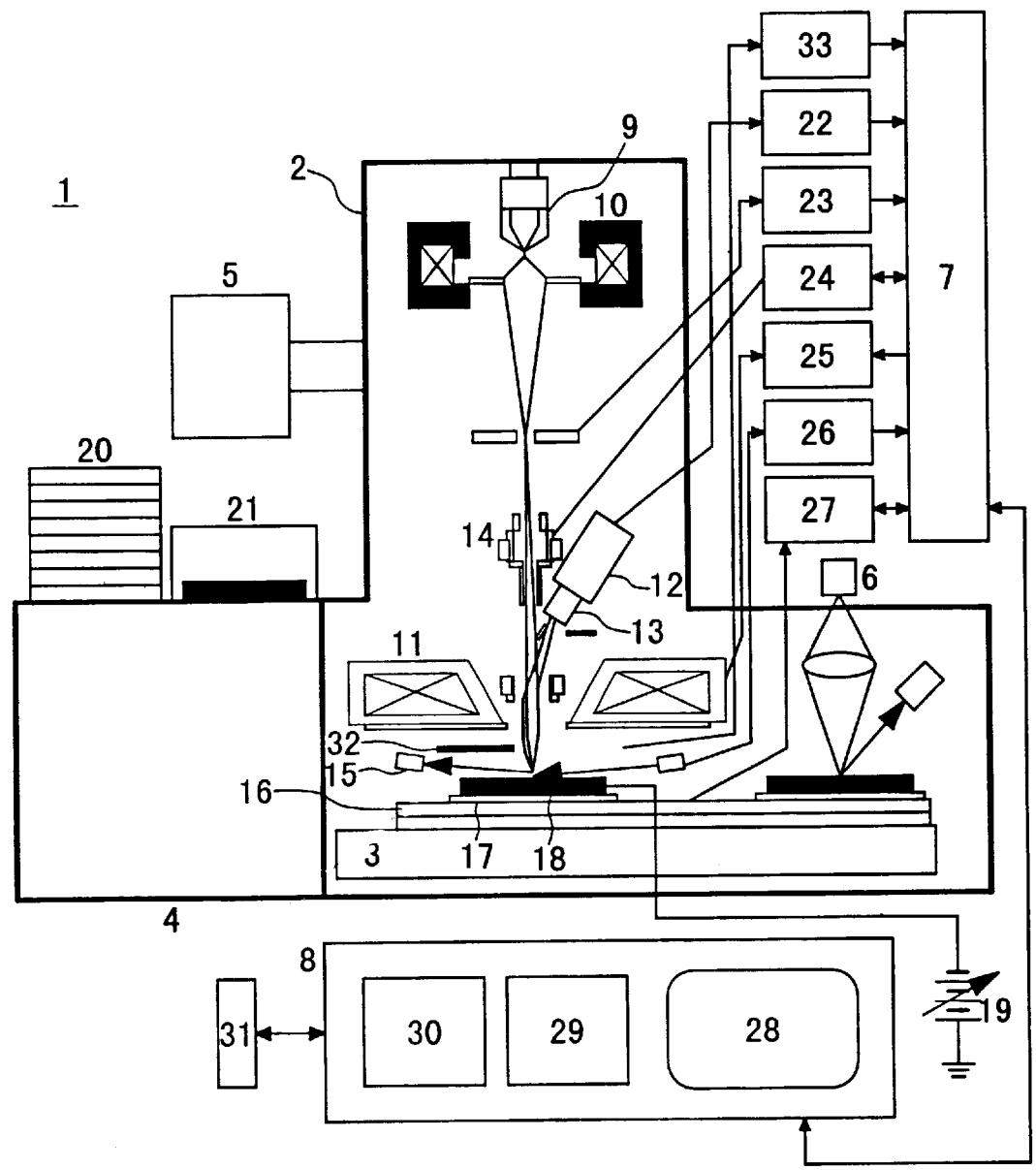
FIG. 1 is a configuration diagram showing an example of a semiconductor inspection system of the invention.
Figure 2A:
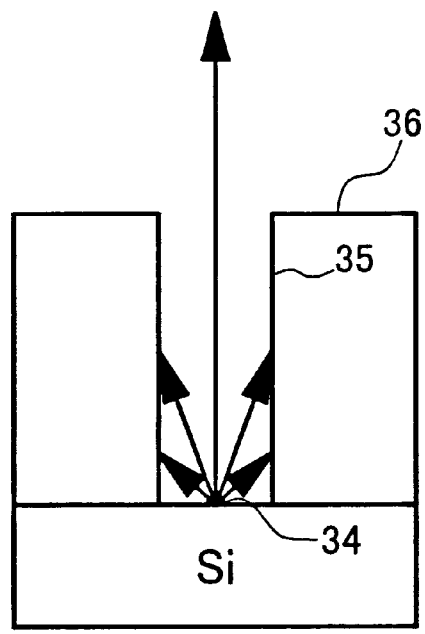
FIGS. 2A and 2B are diagrams for explaining the principle of detecting secondary electrons generated from the bottom of a hole used in the invention.
Figure 2B:
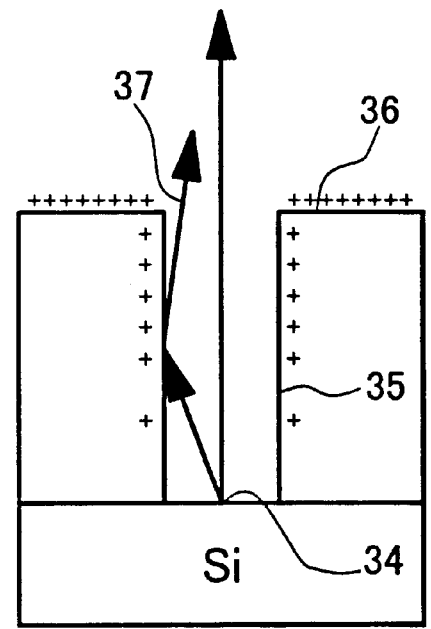

In a first embodiment, an example of method and system for inspecting a hole pattern after dry etching will be described. FIG. 1 shows the configuration of an inspection system for a semiconductor device in the embodiment.

An inspection system 1 for a semiconductor device includes an electron beam optics unit 2, a stage unit 3, a wafer handling unit 4, a vacuum unit 5, an optical microscope unit 6, a control unit 7, and a control unit 8. The electron beam optics unit 2 has an electron gun 9, a condenser lens 10, an objective lens 11, a detector 12, an energy filter 13, a deflector 14 (for example, EXB deflector), an electrode 32 on the top face of a wafer, and a height measure sensor 15. The stage unit 3 includes an XY stage 16, a wafer holder (sample stage) 17, and a retarding power supply 19 for applying a negative voltage to the holder 17 and wafer 18. To the XY stage 16, a position detector by laser length measurement is attached. The wafer handling unit 4 carries the wafer 18 among a wafer case 20, a wafer loading unit 22, and the XY stage 16. The control unit 7 includes a signal detection control unit 22, a blanking control unit 23, a beam deflector control unit 24, an electron beam optics control unit 25, a height measurement unit 26, a stage control unit 27, and an electrode control unit 33. The control unit 8 is constructed by a graphical user interface and user interface unit 28, an image processing unit 29, a data storage unit 30, and an outer server 31.

Figure 4:
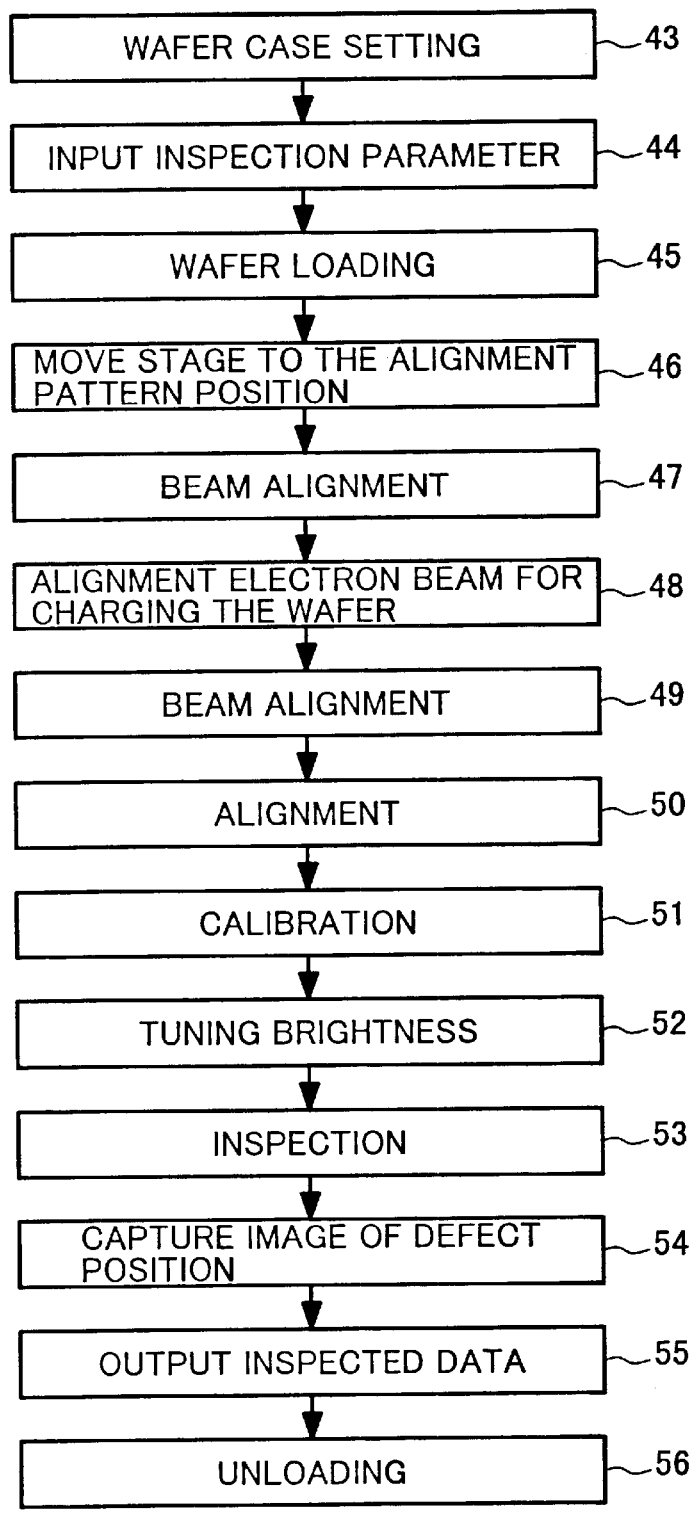
FIG. 4 is a diagram showing an example of an inspection flow in the invention.

A defect detecting method will be described in accordance with an inspection flow. FIG. 4 shows the inspection flow. First, location number in the case of a wafer to be inspected is designated on the graphical user interface 28 (step 43). As information of the wafer to be inspected, information such as aspect ratio, hole diameter, and material of a pattern is input. Further, as irradiation parameters of an electron beam 38 for charging the wafer, parameters such as electron beam irradiation energy, beam current, and beam diameter are input, and a voltage for charging the surface of the wafer is designated. Further, as inspection parameters, an inspection area, electron beam irradiation energy at the time of capturing a secondary electron image, beam current, scan speed, and scan size are input (step 44). From the information of a wafer to be inspected, inspection parameters in a database can be also used. The information of the wafer to be inspected, electron beam irradiation parameters, and inspection parameters can be also input from the outer server 31.

As an electron beam irradiation parameter at the time of positively charging the surface of a wafer, for example, the irradiation energy can be set to a value in a range from 100 eV to 1000 eV so that the electron beam emission efficiency becomes 1 or higher. It is desirable to set the irradiation energy at the time of inspection to the same value as the electron beam for charging a wafer. By setting the irradiation energy at the time of inspection and that of the electron beam for charging the wafer to the same level, the electron beam for charging the wafer and the electron beam for detecting a secondary electron image can be emitted from a single electron source. By emitting an electron beam of relatively low energy, not only the surface of the wafer is positively charged but also an inspection can be conducted while reducing a damage on the semiconductor device.

Figure 5:
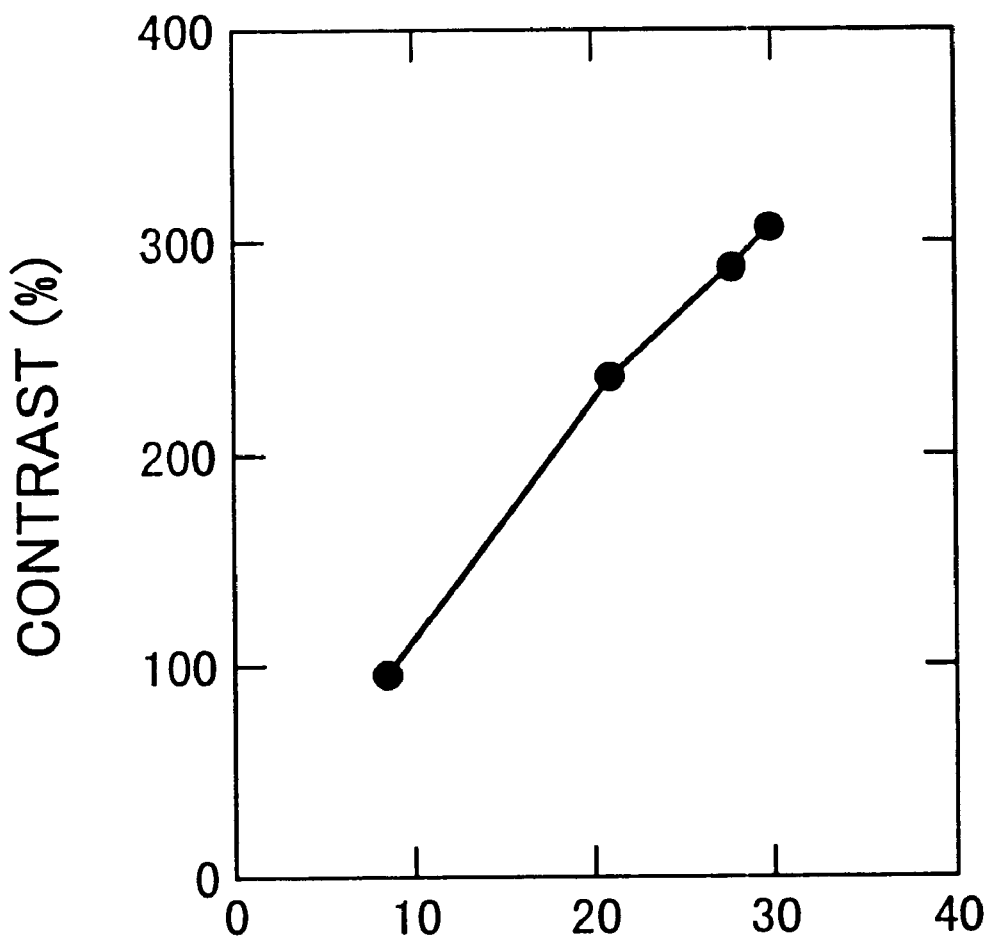
FIG. 5 is a diagram showing charging voltage dependency of brightness of a secondary electron image of holes.

A set value of a voltage for charging the wafer is determined mainly from the aspect ratio of the hole pattern. FIG. 5 shows charging voltage dependency of brightness of a secondary electron image of the holes. Secondary electrons from the bottom of a hole having the aspect ratio of up to 4 can be obtained even when the charging voltage is 5 V or less. When the aspect ratio becomes 8 or higher, as shown in FIG. 5, the wafer has to be charged to 10 V or higher. From a database of dependency on the aspect ratio of a necessary charging voltage preliminarily obtained, the set value of the charging voltage can be also determined. After completion of setting of the inspection parameters, an inspection is started. The inspection parameters can be also preset by using an off-line computer.

When the inspection is started, the wafer 18 is carried to the inspection system. The wafer 18 is carried from the case into the wafer loading unit. After that, the wafer loading unit is evacuated and the wafer 18 is loaded into an inspection chamber which is already evacuated (step 45).

After completion of loading of the wafer, on the basis of the input inspection parameters, the electron beam irradiation parameters at the time of capturing a secondary electron image are set in the units by the electron beam optics control unit 25. The stage 16 is moved so that a beam alignment pattern on the wafer holder 17 is positioned below the electron beam optics unit 2 (step 46). After that, an electron beam image is captured, setting of focus, astigmatism, and the detectors is adjusted to thereby control the contrast and the like of an image (step 47). Simultaneously, the height of the wafer 18 is measured by the height measure sensor 15, and the correlation of the height information and the focus condition of the electron beam is calculated by the wafer height measurement unit 26. After that, when an electron beam image is captured, without performing focusing each time, the parameters can be automatically adjusted to the focus parameters from a result of the wafer height measurement.

When the image adjustment at the time of capturing a secondary electron image is completed, the irradiation parameters of the electron beam 38 for charging the wafer are adjusted (step 48). First, the stage 16 is moved so that the pattern for adjusting the charging voltage is set below the electron beam optics unit 2. As the electron beam 38, a beam having the diameter larger than that of a beam for capturing a secondary electron image by about 100 to 1000 times can be used.

Figure 6:
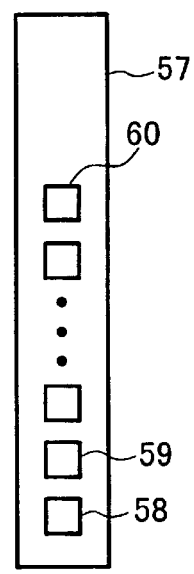
FIG. 6 is an explanatory diagram showing an example of a beam scan method.

FIG. 6 shows an example of a method of scanning the electron beam 38 for charging the wafer and the beam for capturing a secondary electron image. After irradiating a first scanning area 57 with the electron beam for charging, while scanning the electron beam for capturing a secondary electron image, a secondary electron image in a second scanning area 58 included in the first scanning area 57 is captured. The first scanning area 57 is a sufficiently large area including the second scanning area 58. At this time, a secondary electron image is captured by using the energy filter 13.

As an example, an energy filter of a type that captures secondary electrons equal to or larger than a threshold is used. By the energy filter, electrons having energy equal to or higher than a voltage applied to the filter are detected. First, the threshold is set to V0 and a secondary electron image in the secondary scanning area 58 is captured. Signal intensities in holes in the secondary electron image and a portion of an oxide film are stored in the data storage unit 30. Subsequently, a secondary electron image in a third scanning area 59 which is included in the first scanning area 57 but does not include the second scanning area 58 is captured. At this time, the energy filter 13 is set to a threshold V1. Signal intensities in holes and the portion of the oxide film of the secondary electron image are stored into the data storage unit 30. Until the filter voltage at which the signal intensity in the portion of the oxide film changes is obtained, the process of capturing a secondary electron image in an nth scanning area 60 included in the first area 58 by using a filter voltage Vn is repeated.

Figure 7:
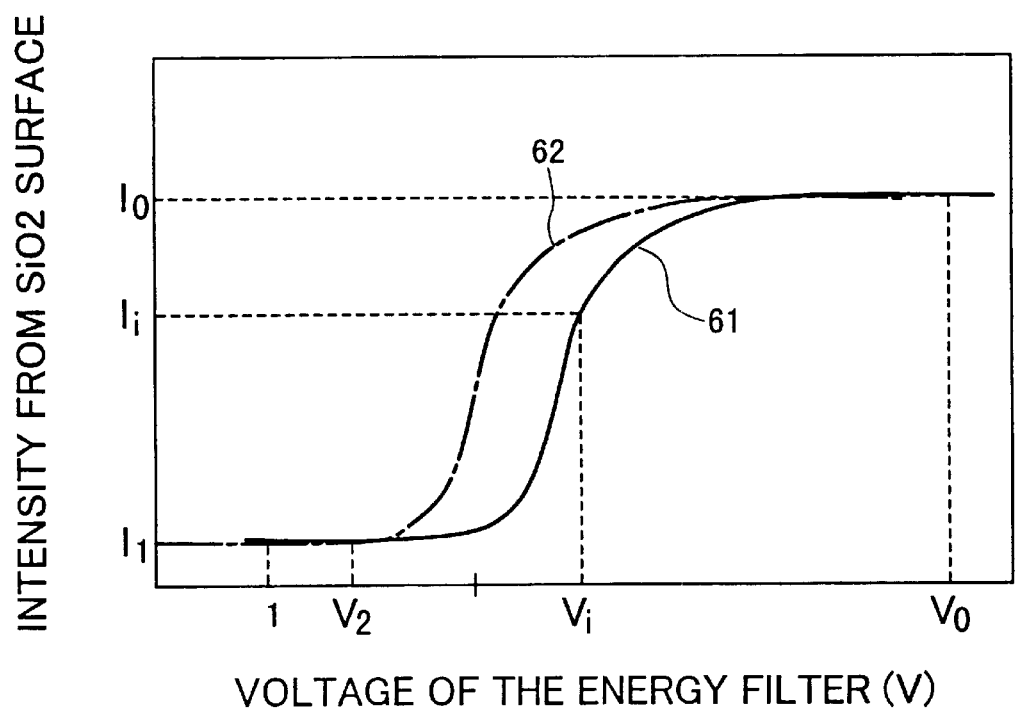
FIG. 7 is a diagram showing an example of a method of setting a filter voltage.

A method of setting the filter voltage Vn at this time will be described by referring to FIG. 7. A signal 61 from the SiO2 surface charged to a voltage changes according to the filter voltage as shown in FIG. 7. At V0, a secondary electron of all the energy is captured, so that the signal intensity is the maximum value I0. At V1, most secondary electrons are not detected, so that the signal intensity is the minimum value I1. The values V0 and V1 are set, for example, in a range from 50 V to −20 V. Further, the values from V2 to Vi are set between V0 and V1, for example, at intervals of 10 V. When the signal intensity becomes equal to or higher than (I0+I1)/2 and equal to or lower than I0, for example, two more voltages are set at an interval of 5 V. When the signal intensity becomes equal to or higher than I1 and equal to or lower than (I0+I1)/2, Vn+5V is set as Vn+1. From the signal intensities, Vm at which the signal intensity is (I0+I1)/2 can be obtained. The voltage for charging the wafer is calculated from a shift amount of a curve of filter voltage dependency of a signal intensity 62 from the Si substrate preliminarily calculated.

While measuring the charging voltage in such a manner, the electron beam for charging the wafer is adjusted until a desired charging voltage is obtained (step 49). Means for measuring the charging voltage by using such a method and optimizing the current value of the electron beam 38 for charging the wafer, electrode 32, and beam energy so that the surface of the wafer is charged to a desired charging voltage is provided.

An actual inspection can be also conducted by using the energy filter 13. The set value of the filter voltage in an inspection can be also determined at the time of measuring the charging voltage. A method of determining the set value of the filter voltage will now be described. A signal intensity $I_{SiO2}$ from the SiO$_2$ film and a signal intensity $I_{Hole}$ from a hole are calculated from a secondary electron image captured at the time of measuring the charging voltage.

Figure 8A:
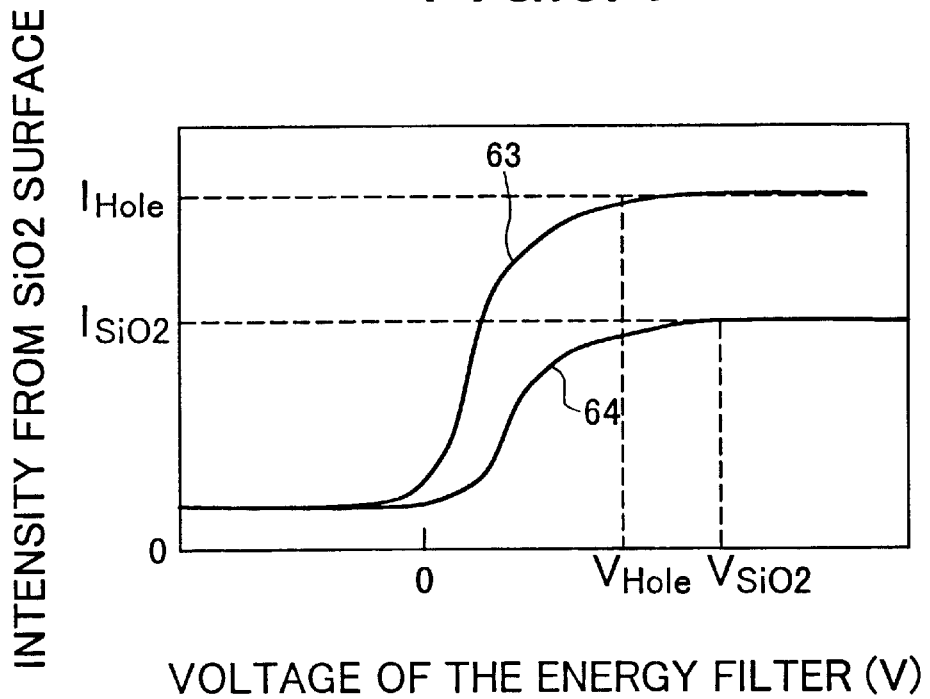
FIGS. 8A and 8B are diagrams showing filter voltage dependency of signal intensity of an oxide film and signal intensity of holes.
Figure 8B:
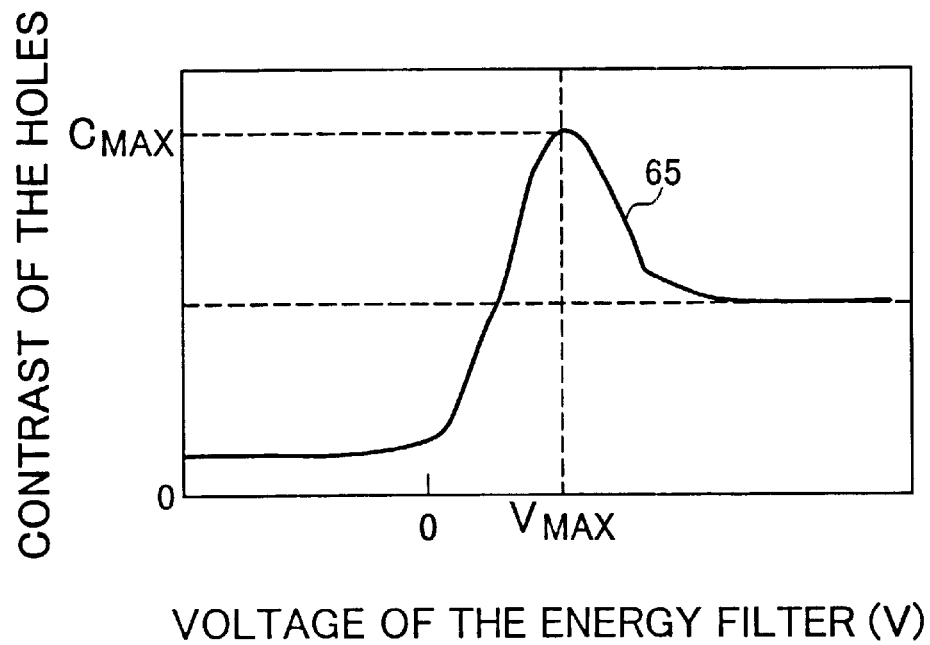

FIG. 8 shows dependency of the filter voltage of intensity 64 from the SiO2 area surrounding the holes and the signal intensity 63 from the holes. Further, contrast $C=(I_{Hole}-I_{SiO2})/I_{SiO2}$ is calculated, and a filter voltage $V_{MAX}$ by which the contrast becomes the maximum is determined as the set value used at the time of the inspection. The determined set value is stored in the data storage unit 30.

After that, when the setting of the electron beam irradiation parameters and image adjustment are completed, alignment is performed by using two points on the wafer 18 (step 50). The wafer 18 to be inspected is disposed in predetermined first coordinates, and an optical microscope image of a circuit pattern formed on the wafer 18 to be inspected is displayed on a monitor in the graphical user interface 28 and compared with an optical microscope image of an equivalent circuit pattern in the same position prestored for position turn calibration, thereby calculating a position calibration value in the first coordinates (step 51).

In the first coordinates, the optical microscope image is switched to an electron beam image. The optical microscope unit 6 and the electron beam optics unit 2 are disposed in positions apart from each other by a predetermined distance and the distance is stored as a known parameter in the system. Consequently, the optical microscope image and the electron beam image can be arbitrarily switched to each other. With respect to the electron beam image as well, an image of a circuit pattern is prestored for position turn calibration in a manner similar to the optical microscope image. By comparing the stored electron beam image with a captured electron beam image, the position calibration value of the first coordinates more accurate than that of the optical microscope is calculated.

Next, the position is moved from the first coordinates to second coordinates which are apart from the first coordinates by a predetermined distance, where a circuit pattern equivalent to that in the first coordinates exists. Similarly, an optical microscope image is captured and compared with a circuit pattern image stored for position turn calibration, and a position calibration value and a turn deviation amount from the first coordinates are calculated from the second coordinates. Further, also in the second coordinates, the optical microscope image is switched to the electron beam image and compared with the electron beam image of the prestored circuit pattern, and an accurate position calibration value in the second coordinates is calculated. On the basis of the calculated turn deviation amount and positional deviation amount, in the control unit 25 and the beam deflector control unit 24, the scan deflection position of the electron beam is calibrated so as to correspond to the coordinates of the circuit pattern.

When alignment of the wafer 18 to be inspected is completed in such a manner, the wafer 18 to be inspected is irradiated with an electron beam 38 for charging the wafer, an electron beam image is obtained, and brightness is tuned (step 52). At the time of capturing an electron beam image on the basis of the inspection parameter file, since an electron beam current, electron beam irradiation energy, a voltage to be applied to the energy filter 13, the detector 12 to be used, and the gain of a detection system are set, an electron beam image is captured by setting those parameters.

After completion of the brightness adjustment, an inspection is carried out (step 53). An inspection area is preliminarily designated in an inspection parameter file. In the case of emitting the electron beam 38 for charging the wafer, the wafer is divided into a plurality of inspection areas. By alternately repeating the charging of the wafer and capturing of a secondary electron image, the surface of the wafer can be efficiently positively charged during the time of movement of the wafer.

FIG. 9 shows an example of the electron beam scanning method. First, a first irradiation area 66 is irradiated and scanned with the electron beam 38 for charging the wafer as shown in FIG. 9A with the set parameters. A first scanning area 67 is scanned with the electron beam 39 for detecting the secondary electrons as shown in FIG. 9B and a secondary electron image is obtained. Subsequently, as shown in FIG. 9C, a second irradiation area 68 is irradiated with the electron beam 38 for charging the wafer, and a second scanning area 69 is scanned with the electron beam 39 for detecting the secondary electrons. At this time, the electron beam 38 for charging the wafer can be emitted while moving the wafer. In such a manner, the electron beam 38 for charging the wafer can be emitted during the period of movement of the wafer, so that the inspection can be conducted without spending extra time for charging the wafer.

By repeating the operations as shown in FIG. 9, the whole surface of the wafer can be inspected. At the time of the inspection, while continuously moving the XY stage 16, a predetermined area in the wafer 18 to be inspected is irradiated with an electron beam. While sequentially forming electron beam images, an image signal is compared with a signal stored in the data storage unit 30, and the images are sequentially stored in the data storage unit 30. In such an inspection, the detector 12 is preset by an inspection parameter file 204. A voltage can be also applied to the energy filter 13 disposed at the ante-stage of the detector 12.

A method of determining a defect of a hole will now be described. For example, in the case where the film is made of silicon oxide ($SiO_2$), after a secondary electron image is captured, a defect is determined by the following method.

Figure 10A:
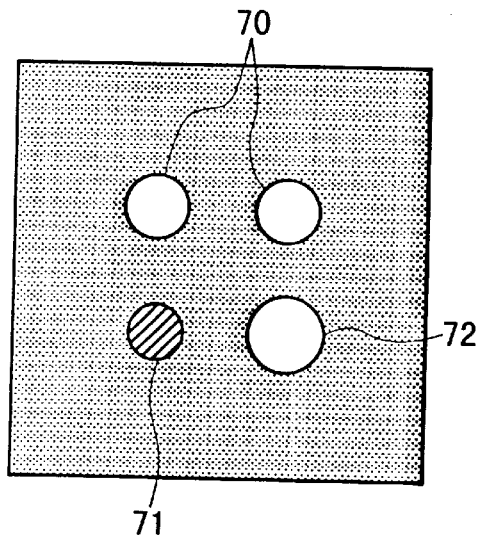
FIGS. 10A and 10B are diagrams showing an example of a secondary electron image of a contact hole pattern and a defect determining flow, respectively.
Figure 10B:
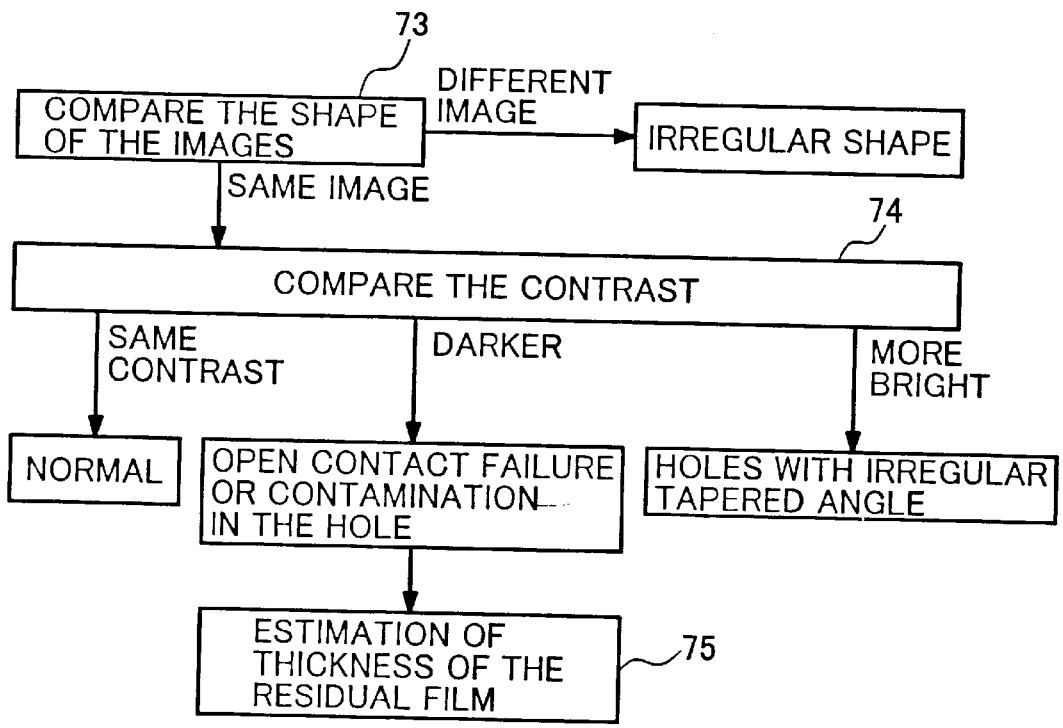

FIG. 10A shows an example of a secondary electron image of a pattern in which contact holes are formed and FIG. 10B is a defect determining flow. A hole 72 with an open contact failure shown in FIG. 1A is observed darker than an open hole 70. On the other hand, a hole 72 with an irregular tapered angle is observed lighter and bigger than the open hole 70.

Figure 11:
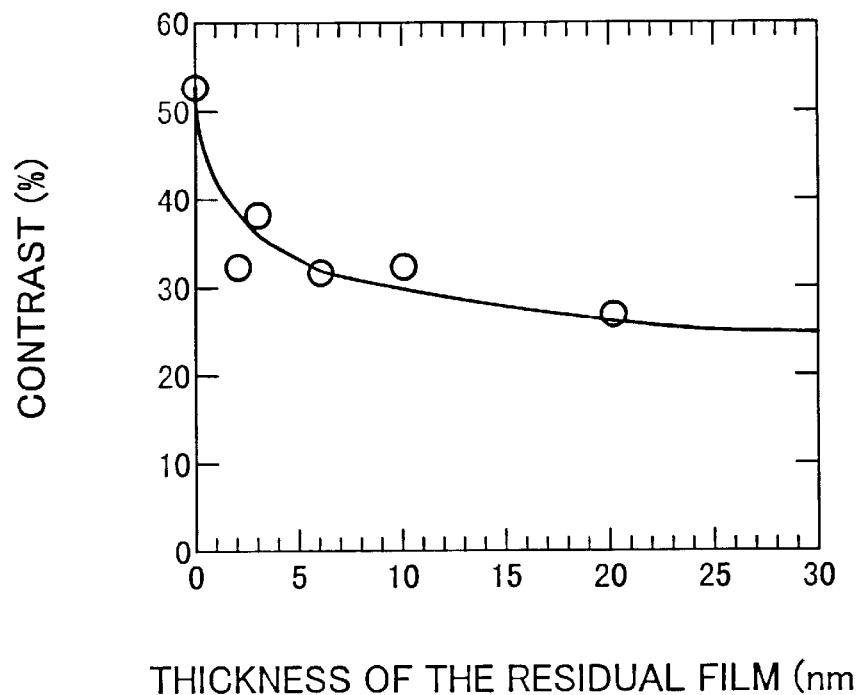
FIG. 11 is a diagram showing residual film thickness dependency of contrast of a hole pattern.

FIG. 11 shows residual film thickness dependency of contract of holes. The thickness of a residual film of zero indicates contrast of an open hole. Since the hole 71 with an open contact failure is observed darker than the open hole 70, the hole 71 with an open contact failure can be determined as a defect. At this time, the contrast of the hole 71 with the open contact failure decreases as the thickness of the residual film increases, so that the thickness of the residual film of the hole 71 with the open contact failure can be also estimated from the contrast of the hole.

The defect determination is made from the captured secondary electron image as follows. First, as shown in FIG. 10B, the shapes of secondary electron images are compared with each other (step 73). When the shape of the obtained image does not coincide with that of the reference secondary electron image, an irregular shape is determined. Further, the captured image is compared with a secondary electron image for comparing the contrast of holes (step 74). When the captured image has the contrast which is almost the same as that of the reference image, the hole in the captured image is determined as an open hole. When the hole in the captured image is darker than that in the reference image, an open contact failure or contamination in the hole is determined. When the contrast of the hole in the captured image is brighter than that in the reference image, the hole in the captured image is determined as a hole with an irregular tapered angle. Consequently, the hole 71 is determined as a hole with an open contact failure, and the hole 72 is determined as a hole with irregular tapered angle.

Further, the thickness of the residual film can be also estimated from the contrast data of the hole with open contact failure prestored in the data storage unit 30 or the outer server 31 (step 75). Data can be retrieved from a database of changes in contrast according to the thickness of the residual film in accordance with parameters such as the aspect ratio of the hole, hole diameter, charging voltage, and material of an insulating film.

There is a case such that a junction of a different kind is included in the bottom of a contact hole. Since the resistance of the bottom of the open hole varies according to the kind of a junction, the brightness of the hole changes according to the kind of the junction. In such a case, patterns of the same kind are compared with each other by using information of pattern arrangement on the wafer, thereby comparing the holes having junctions of the same kind with each other. Particularly, when a pn junction having an n diffusion layer as an upper layer is provided is formed on the bottom of the contact hole, the contrast of the hole decreases.

Figure 12:
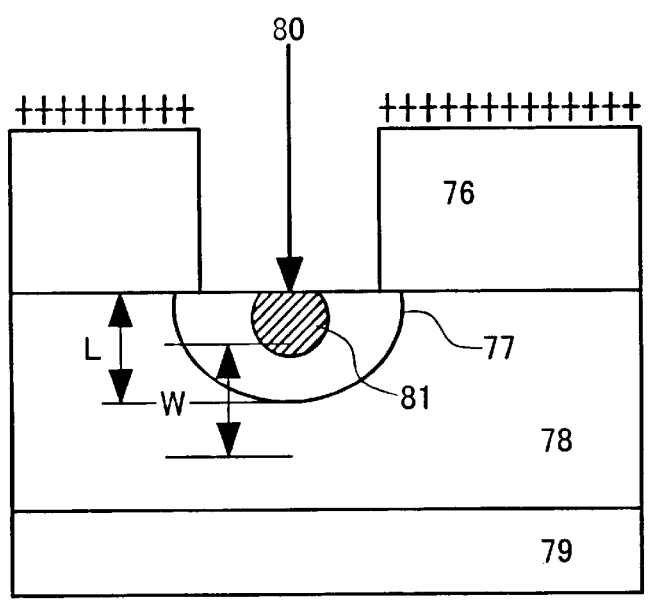
FIG. 12 is an explanatory diagram of the case where a pn junction is formed.

FIG. 12 is a diagram showing a model in the case where a pn junction is formed. Shown in the diagram are an insulator 76 between layers, an n-type diffusion layer 77, a p-well 78, a silicon substrate 79, and a primary electron beam 80.

On the bottom of a hole having no pn junction, when an electron beam is emitted with a parameter that the electron beam emission efficiency is 1 or higher, electrons are supplied from the wafer, so that the voltage at the bottom of the hole becomes 0 V. However, when the n-diffusion layer 77 is irradiated with an electron beam, electrons are not supplied from the substrate 79 side because of the pn junction, and the bottom of the hole is charged. Consequently, the contrast becomes low. In such a case, by optimizing the electron beam energy, the contrast can be improved.

For example, a case where the depth of a junction is L and a depletion layer area having a width W is formed in the junction are a will be described. After atomic weight (A), atomic number (Z), and density ($\rho$) of the sample are determined, depth R of intrusion of an electron is determined by the energy of the electron. For example, when Si is irradiated with an electron beam having incident energy of 500 eV, the depth R of intrusion of the electron beam is 10 to 20 nm. The higher the energy of the electron beam is, the deeper the depth R of intrusion of the electron becomes. When the depth R of intrusion of the electron beam is small and the electron does not enter the depletion layer area, if the n-type diffusion layer 77 is irradiated with the electron beam 80, the surface is positively charged. When the irradiation energy of the electron beam and the voltage charged on the surface are adjusted to make the electron beam start entering the depletion layer, an electron-hole pair is generated in the depletion layer, so that resistance in the junction decreases. As a result, electrons are supplied from the substrate 79, so that charging of the bottom of the hole is suppressed, and the contrast of the secondary electron of the hole can be improved.

There is a case such that a conductive material such as poly Si of a mask is used on the surface of the wafer to be inspected. At this time, it is difficult to charge the surface of the wafer to 5 V or higher. On the other hand, there is a case such that the bottom of the hole is an insulating film made of SiN or resistance of the junction is high and a current is not easily supplied to the bottom of the contact hole. Since the bottom of the hole is charged by being irradiated with the electron beam, it is difficult to pull out and detect secondary electrons emitted from the bottom of the hole.

Figure 3A:
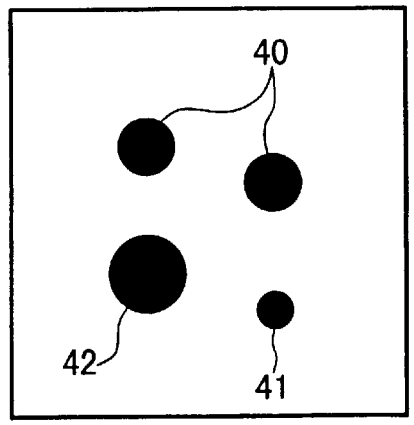
FIGS. 3A, 3B, and 3C are diagrams for explaining the principle of detecting a defect by negative charging used in the invention.
Figure 3B:
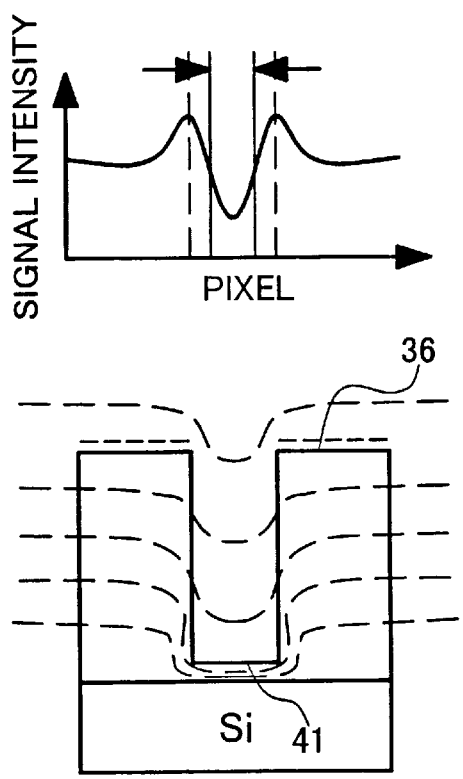
Figure 3C:
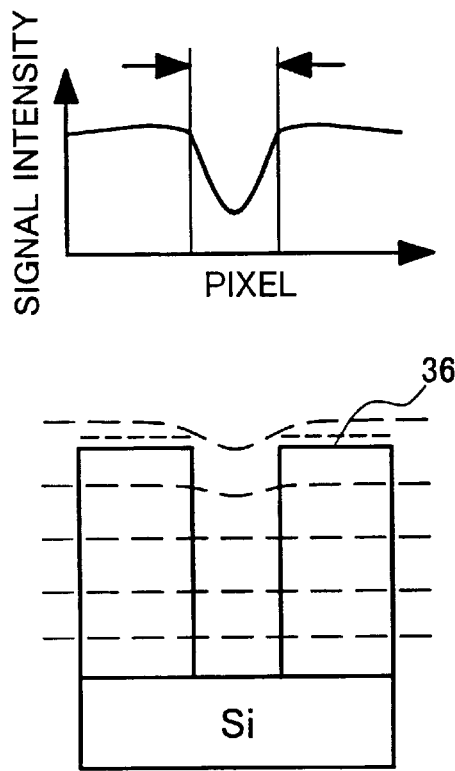

The method of inspecting the hole with an open contact failure in such cases will now be described. When the surface of the wafer is irradiated with an electron beam, even if the surface of the wafer is charged positively, as shown in FIG. 3, the secondary electron image of an open hole 40 is observed dark. In the case of the hole with the open contact failure, a residual film 41 on the bottom is charged more than the bottom of the open hole 40. By a change in the electric field of the open hole, the hole with the open contact failure is observed smaller than the open hole. The dimension of the hole with failure is observed smaller as the residual film on the bottom becomes thicker (41 in FIG. 3). When the contact hole is tapered, the hole is observed larger than the open hole (42 in FIG. 3). Means for determining a hole with the open contact failure on the basis of the size of the observed secondary electron image and automatically determining the kind of the failure is provided. Means for calculating the thickness of the film residing on the bottom from the dimension of the hole with open contact failure on the basis of the relation between the prestored hole dimension and the hole with open contact failure is provided.

Figure 13:
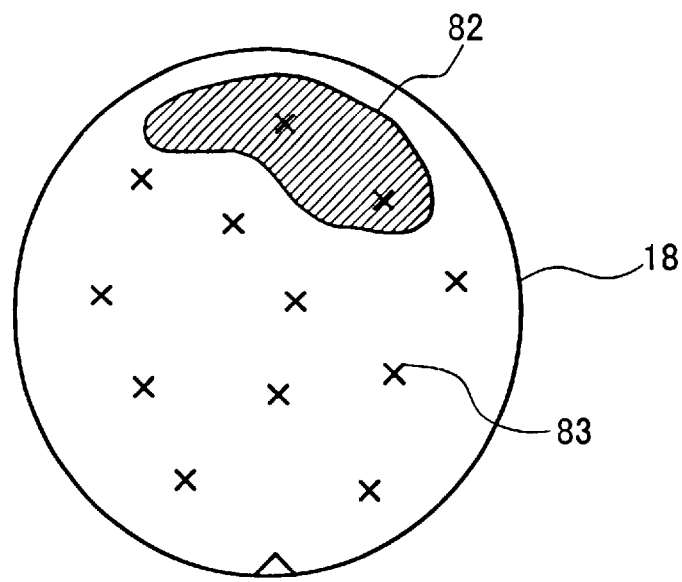
FIG. 13 is a diagram showing an example of a defect distribution displayed on a wafer map.

Coordinates, signal value, kind of the failure, size of the failure hole, and the like of the position determined as a failure by using a method as described above are automatically recorded and, as shown in FIG. 13, marks each indicative of a failure are displayed by kind in the position corresponding to the wafer map on the graphical user interface 28. After completion of the inspection on the area designated by the inspection parameter file, an image of the hole with failure can be captured again (step 54 in FIG. 4).

As described above, by positively charging the surface of the wafer, it becomes possible to conduct an inspection for the hole with the open contact failure. On the other hand, a method of detecting a short-circuit failure of a semiconductor circuit at high speed by using positive charging is proposed. It enables the hole with the open contact failure and the short circuit failure to be inspected at high speed with high sensitivity by using the same inspection system. Further, as will be described in the second embodiment, the electron beam irradiation energy and the voltage of an electrode provided on the surface of the wafer are adjusted so as to attain a desired negative charging voltage, thereby enabling the surface of a wafer to be controlled to a desired positive or negative charging voltage by the same system. Thus, irrespective of the kind and material of the circuit pattern of the semiconductor device, defects of a plurality of kinds of a semiconductor circuit can be detected.

Figure 14:
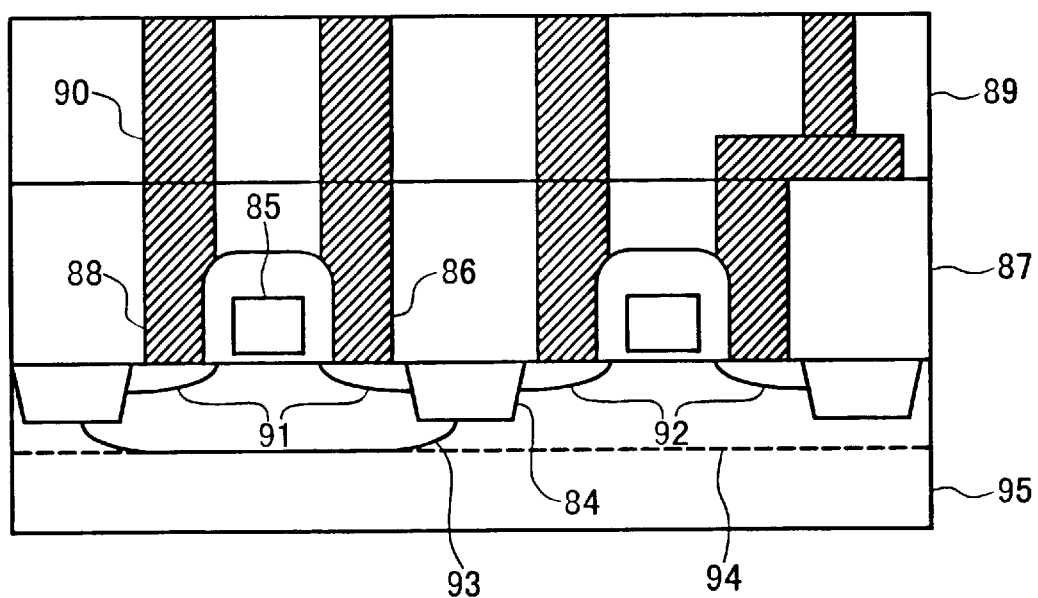
FIG. 14 is a schematic cross section showing an example of a semiconductor device having a hole pattern inspected by the invention.

FIG. 14 is a schematic block diagram of a DRAM as an example of a semiconductor device having a hole pattern inspected by the invention. An active region formed on a semiconductor substrate 84 is dived by a field oxide layer 83. A gate electrode 85 is formed over the active region and covered with a spacer 86. A first insulation layer 87 such as an oxide film is formed on the surface and, after that, a first contact hole 88 is formed by dry etching. The contact hole 88 is formed as a direct contact for a bit line. After forming a bit line, a second insulation layer 89 is formed, and a second contact hole 90 is opened. As an example of the inspection according to the invention, the direct contact hole 88 being subjected to a DRAM manufacturing process shown in FIG. 14 and a hole 89 formed on the wiring are inspected. Further, holes formed on the other wiring can be also inspected. Alternately, an inspection can be also conducted after a process of developing a mask pattern for forming a hole pattern. Shown in FIG. 14 are a p-type diffusion layer 91, an n-type diffusion layer 92, an n-well 93, a p-well 94, and a substrate 95.

As described above, the wafer including the contact hole pattern can be inspected and a defect can be automatically determined. Further, a mechanism for automatically specifying a defect causing process and a factor from a preliminarily formed database with respect to some factors of the occurrence of defects on the basis of the kind of a defect and a distribution of defects in the plane of the wafer is provided. Further, a mechanism for finely adjusting parameters of a defect causing process is provided. A mechanism for reducing a defect on a wafer to be inspected by performing an additional process on the wafer on the basis of detected defect information is also provided.

An example of the mechanism for finely adjusting the parameters of the semiconductor manufacturing process on the basis of the inspection result will be described. In the case where a number of holes with open contact failure occur in a concentrical shape or on the whole surface of the wafer, time of dry etching for opening the holes can be finely adjusted according to the thickness of a residual film on a hole with open contact failure. In the case where a defect such as a hole with open contact failure or a tapered hole occurs in a specific pattern, lithography parameters are finely adjusted or a reticle is replaced. In the case where a number of defects occur due to condensed or rare patterns around a semiconductor memory mat or the like, flow rate of dry etching gas is finely adjusted, an etcher is cleaned, or the like. When a number of foreign matters occur, a semiconductor manufacturing device is cleaned or dry etching parameters are finely adjusted.

On the other hand, a mechanism for adding a process capable of reducing defects in a wafer to be tested is provided. In the case where a number of holes with open contact failure occur due to insufficient dry etching, dry etching can be added. When a number of foreign matters occur, cleaning can be added. As a result, it becomes possible to specify a process in which a failure occurs and the cause of the failure at an early stage, and perform feedback to a semiconductor manufacturing process such as a dry etching process at an early stage.

Second Embodiment

In a second embodiment, a method of carrying out an inspection on a hole pattern after dry etching and, as an example of an apparatus, a method of negatively charging the surface of an oxide film and conducting an inspection will be described. In the embodiment, the semiconductor inspection system shown in FIG. 1 can be used.

In the case of charging the surface 36 of a wafer to a desired negative voltage, when the surface 36 of the wafer is a silicon oxide film or an insulating film made of an organic material, as an electron beam irradiation energy for charging the wafer, an electron beam of 1000 eV or higher at which the secondary electron emission efficiency becomes 1 or less is emitted. The irradiation energy of the electron beam 39 for detecting secondary electrons is desirably set to the same value as that of the electron beam for charging the wafer. By setting the irradiation energy at the time of inspection and that of the electron beam for charging the wafer to the same level, an electron beam for charging the wafer and an electron beam for capturing a secondary electron image can be emitted by using a single electron source. Further, to efficiently negatively charge the surface of the wafer, an optimum voltage is applied to the electrode 32 mounted on the top face of the wafer.

A method of setting electron beam irradiation parameters such as the beam energy, beam current, and electron beam irradiation time and setting of an electrode voltage will be described. These set values may be read from an inspection parameter data file prestored. First, a set value of the voltage for charging the wafer is determined mainly from an aspect ratio of a hole pattern.

A method of setting electron beam irradiation parameters so as to satisfy a desired negative charge voltage after completion of loading of the wafer (step 45) in the inspection flow shown in FIG. 4 will be described. As an example, a method of capturing a secondary electron image by using an energy filter of a type that captures secondary electrons equal to or higher than a threshold and measuring a charging voltage is used. First, the stage 16 is moved so that a pattern for adjusting a charging voltage is positioned below the electron beam optics unit 2. The threshold is set to V0 and a secondary electron image in a first area is captured. Signal intensities of holes in the secondary electron image and the portion of an oxide film are stored in the data storage unit 30.

Subsequently, an energy filter sets the threshold to V1 and captures a secondary electron image in a second area. Signal intensities in holes in the secondary electron image in the second area and the oxide film portion are stored in the data storage unit 30. Until a filter voltage at which the signal intensity 61 of the oxide film portion changes is obtained, the process of capturing the secondary electron image in an n-th area included in the first area by a filter voltage Vn is repeated. As a method of setting the filter voltage Vn at this time, as an example, the method described in the first embodiment can be used. From the signal intensities, Vm at which (I0+I1)/2 is obtained can be calculated.

The voltage for charging the wafer is calculated from a shift amount from a curve of filter voltage dependency of signal intensity from the Si substrate preliminarily obtained. While changing the electron beam irradiation parameters, the charging voltage is repeatedly measured. Until a desired charging voltage is obtained, an electron beam is adjusted. Means for measuring the charging voltage by using such a method and optimizing current values of the electron beam for charging the wafer and the electron beam for capturing an image, irradiation time, beam energy, and electrode voltage so that the surface of the wafer is charged to a desired charging voltage is provided.

After completion of adjusting the electron beam irradiation parameters and images, alignment of the wafer (step 50), calibration (step 51), and tuning of brightness (step 52) are performed. After that, an inspection is conducted (step 53). At the time of capturing a secondary electron image used for inspection, a voltage is applied to the energy filter 13 disposed at the ante-stage of the detector 12, thereby enabling detection sensitivity to be improved.

A method of determining failure of a hole will now be described. In the case of negatively charging the surface of a wafer, as shown in FIG. 3, a secondary electron image of the open hole 40 is observed dark. In the case of the hole 41 with open contact failure, the oxide film remaining on the bottom portion is charged and the electric field of the opening changes, so that the hole 41 is observed smaller than the open hole. A defective hole such as the hole 41 is observed smaller as the thickness of the film remaining on the bottom increases. In the case of a tapered contact hole 42, the contact hole 42 is observed larger than the open hole. Consequently, means for determining a defective hole on the basis of the sizes of holes in the observed secondary electron image, and automatically determining the kind of a defect is provided. Means for calculating the thickness of the film remaining on the bottom from the size of the defect hole on the basis of the relation between prestored hole size and the defective hole is provided.

There is a case such that junctions of different kinds are included in the bottom of a contact hole. Since the resistance of the bottom of the open hole varies according to the kind of a junction, the size of the hole changes according to the kind of the junction. In such a case, patterns of the same kind are compared with each other by using information of pattern arrangement on the wafer, thereby comparing the holes having junctions of the same kind with each other.

With respect to the position determined as a failure by the inspection, the coordinates, signal value, the kind of the failure, the size of the failure, and the like in the position are automatically recorded. FIG. 13 shows a result of the inspection. In the inspection, a distribution 82 of holes with open contact failure and a distribution 83 of holes with irregular shapes are detected on the wafer 18. Marks indicative of failures are displayed in corresponding positions on the wafer map in the graphical user interface 28 kind by kind on the basis of the result of classification. After completion of the inspection on the area designated by the inspection parameter file, an image of the failure position can be captured again (step 54 in FIG. 4).

As described above, the inspection can be conducted on the wafer including the contact hole pattern by negatively charging the surface of the wafer, and a failure can be automatically determined. As a result, an inspection on a wafer to be inspected made of a material or having a circuit pattern which is difficult to be positively charged as shown in the first embodiment can be also conducted.

By using the methods of the embodiments, therefore, an inspection can be conducted on various kinds of patterns to see the presence or absence of a failure, for example, whether, a hole is an open hole or a hole with open contact failure in a hole pattern after the dry etching process in a non-destructive manner. As a result that deep holes can be evaluated non-destructively, a semiconductor device can be manufactured in such a manner that a wafer is taken out during a manufacturing process, subjected to an inspection and, after the inspection, returned to the process. Since an inspection on holes can be carried out before a wiring process, a dry etching process development period can be largely shortened. Further, the kind of a defect, a distribution of defects in the plane of the wafer, and the position of the failure can be obtained at high speed, an abnormal process can be found at an early stage, and the factor of occurrence of the failure can be estimated in a short period.

Although the case of the inspections using the electron beam has been described in the foregoing embodiments, the invention can be also applied to an inspection using a charged particle beam other than the electron beam, for example, an ion beam.

The invention will be summarized as follows. As a first invention, there is provided a wafer inspection system using a charged particle beam, including: a charged particle source; an objective lens for irradiating a wafer on which a pattern including a hole pattern is formed with a primary charged particle beam from the charged particle source; a sample stage for holding the wafer; a charged particle generator for positively charging the surface of the wafer placed on the sample stage; a deflector for irradiating a predetermined area in the wafer positively charged with a primary charged particle beam; and a detector for detecting a secondary charged particle from the wafer positively charged, wherein an inspection is conducted on the hole pattern on the basis of a signal from the detector. In associated with the above, an electron source is provided as the charged particle generator.

As a second invention, there is also provided a wafer inspection system using a charged particle beam, including: a charged particle source; an objective lens for irradiating a wafer on which a pattern including a hole pattern is formed with a primary charged particle beam from the charged particle source; a sample stage for holding the wafer; a charged particle generator for positively charging the surface of the wafer placed on the sample stage; a deflector for scanning and irradiating a predetermined area in the wafer charged by the charged particle generator with a primary charged particle beam; a detector for detecting a secondary charged particle from the wafer charged; an energy filter disposed between the sample stage and the detector so as to select and pass an energy of the secondary charged particle; and a control unit for controlling the charged particle generator on the basis of a signal from the detector.

As a third invention, there is provided a wafer inspection system using a charged particle beam, including: a charged particle source; a first deflector for scanning a wafer on which a pattern including a contact hole is formed with a primary charged particle beam from the charged particle source; an objective lens for irradiating the wafer on which the pattern including the contact hole is formed with the primary charged particle beam; a sample stage for holding the wafer; a positive charged particle generator for positively charging the surface of the wafer placed on the sample stage; a deflector for irradiating a predetermined area in the wafer positively charged; a detector for detecting a secondary charged particle from the wafer positively charged; a decelerator which is provided for the sample stage and operates so as to decelerate the primary charged particle beam and accelerate the secondary charged particle; and a second deflector filter disposed between the first deflector and the objective lens, for separating the primary charged particle and the secondary charged particle from each other, wherein an inspection is conducted on the contact hole on the basis of a signal from the detector. In associated with the above, the decelerator supplies a negative voltage. The second deflector is an EXB type deflector.

As a fourth invention, there is provided a wafer inspection system using a charged particle beam, including: a sample stage for holding a sample; a first charged particle beam source for supplying a first charged particle beam to a sample having a hole pattern; a second charged particle beam source for supplying a second charged particle beam; a switch for making a switch between the first charged particle beam and the second charged particle beam to irradiate the sample having the hole pattern with the selected charged particle beam; an objective lens for irradiating the sample irradiated with the first or second charged particle beam with a third charged particle beam; and a detector for detecting a fourth charged particle from the sample, wherein an inspection is conducted on the hole pattern on the basis of a signal from the detector.

As an invention of a first inspection process, there is provided a wafer inspection process using a charged particle beam, comprising: a step of holding a wafer on which a pattern including a hole pattern is formed on a sample stage; a step of charging the surface of the wafer placed on the sample stage with a positive charged particle; a deflecting step of scanning and irradiating the wafer with a primary charged particle beam; a step of detecting a secondary charged particle from the wafer positively charged by a detector; and a step of determining whether the hole pattern is good or not on the basis of a signal from the detector. In the invention, as the charging step, a step of setting a voltage of the surface of the wafer to a range from 5 volts to 50 volts may be included. As the charging step, a step of controlling irradiation energy of the positive charged particle to a range from 100 electron volts to 1,000 electron volts may be included.

As an invention of a second inspection process, there is provided a wafer inspection process using a charged particle beam, comprising: a step of holding a wafer on which a pattern including a hole pattern is formed on a sample stage; a step of charging the surface of the wafer placed on the sample stage with a negative charged particle of energy equal to or higher than 1 kilo electron volt; a deflecting step of scanning and irradiating the wafer with a primary charged particle beam; a step of detecting a secondary charged particle from the wafer negatively charged by a detector; and a step of determining whether the hole pattern is good or not on the basis of a signal from the detector.

As an invention of a third inspection process, there is provided a wafer inspection process using a charged particle beam, comprising: a step of holding a wafer on which a pattern including a hole pattern is formed on a sample stage; a step of charging the wafer with a first charge particle beam from a charged particle source; a charging the surface of the wafer placed on the sample stage with a first charged particle beam from the charged particle source; a step of scanning and irradiating a predetermined area in the charged wafer with a primary charged particle beam; a step of detecting a secondary charged particle from the wafer charged by a detector; and a step of determining whether the hole pattern is good or not on the basis of a signal from the detector.

As an invention of a fourth inspection process, there is provided a wafer inspection process using a charged particle beam, comprising: a step of continuously moving a sample stage in a first direction, irradiating a predetermined area in a wafer with a primary charged particle beam, and determining whether a hole pattern is good or not on the basis of a signal from a detector by using: a charged particle source; an objective lens for irradiating a wafer on which a pattern including a hole pattern is formed with a primary charged particle beam from the charged particle source; a sample stage which holds the wafer and reciprocates; a positive charged particle generator for positively charging the surface of the wafer placed on the sample stage; a deflector for irradiating a predetermined area in the wafer positively charged with a primary charged particle beam; and a detector for detecting a secondary charged particle from the wafer positively charged; and a step of charging the wafer with the positive charged particle beam from the positive charged particle generator when the sample stage is continuously moved in a second direction which is different from the first direction.

As an invention of a fifth inspection process, there is provided a wafer inspection process using a charged particle beam, comprising: a step of charging a predetermined area in a pattern including a contact hole formed on a wafer with a positive charged particle beam; a first deflecting step of scanning and deflecting the wafer charged by the primary charged particle beam from a charged particle source by a first deflector; a step of detecting a secondary charged particle from the wafer positively charged by a detector; a decelerating step of decelerating the primary charged particle beam and accelerating the secondary charged particle; a step of separating the first charged particle beam and the second charged particle from each other by a second deflector; and a step of determining whether the contact hole is good or not on the basis of a signal from the detector.

Further, as an invention of a sixth inspection process, there is provided a wafer inspection process using a charged particle beam, comprising: a step of holding a sample having a hole pattern on a sample stage; a first charging step of supplying a first charged particle beam to the sample; a second charging step of supplying a second charged particle beam; a step of making a switch between the first charged particle beam and the second charged particle beam in accordance with a sample; a step of irradiating the sample irradiated with the first or second charged particle beam with a third charged particle beam; a step of detecting secondary particles from the sample by a detector; and a step of determining whether the hole pattern is good or not on the basis of a signal from the detector.

As described above, according to the invention, the wafer inspection system and the wafer inspection process capable of conducting an inspection for a defect on a wafer such as a semiconductor wafer having a pattern including a large step such as a hole pattern at high speed and with high precision can be realized. Particularly, the process development period and yield improvement period in the semiconductor device manufacturing process can be largely shortened, so that the improved reliability and productivity of the semiconductor device can be achieved.

What is claimed is:

1. A wafer inspection system using a charged particle beam, comprising:
    a charged particle source;
    an objective lens for irradiating a wafer on which a pattern including a hole pattern is formed with a primary charged particle beam from said charged particle source;
    a sample stage for holding said wafer;
    a charged particle generator for positively charging the surface of said wafer placed on said sample stage and the side wall of said hole pattern formed on said wafer;
    a deflector for irradiating a predetermined area in said wafer positively charged with a primary charged particle beam; and
    a detector for detecting a secondary charged particle from said wafer positively charged,
    wherein an inspection is conducted on said hole pattern on the basis of a signal from said detector.

2. The wafer inspection system using a charged particle beam according to claim 1, wherein an electron source is provided as said charged particle generator.

3. A wafer inspection system using a charged particle beam, comprising:
    a charged particle source;
    an objective lens for irradiating a wafer on which a pattern including a hole pattern is formed with a primary charged particle beam from said charged particle source;
    a sample stage for holding said wafer;
    a charged particle generator for positively charging the surface of said wafer placed on said sample stage and the side wall of said hole pattern formed on said wafer;
    a deflector for scanning and irradiating a predetermined area in said wafer charged by said charged particle generator with a primary charged particle beam;
    a detector for detecting a secondary charged particle from said wafer charged;
    an energy filter disposed between said sample stage and said detector so as to select and pass an energy of the secondary charged particle; and
    a control unit for controlling said charged particle generator on the basis of a signal from said detector.

4. A wafer inspection system using a charged particle beam, comprising:
    a charged particle source;
    a first deflector for scanning a wafer on which a pattern including a contact hole is formed with a primary charged particle beam from said charged particle source;
    an objective lens for irradiating said wafer on which the pattern including the contact hole is formed with the primary charged particle beam;
    a sample stage for holding said wafer;
    a positive charged particle generator for positively charging the surface of said wafer placed on said sample stage and the side wall of said contact hole formed on said wafer;
    a deflector for irradiating a predetermined area in said wafer positively charged;
    a detector for detecting a secondary charged particle from said wafer positively charged;
    a decelerator which is provided for said sample stage and operates so as to decelerate the primary charged particle beam and accelerate the secondary charged particle; and
    a second deflector filter disposed between said first deflector and said objective lens, for separating the primary charged particle and the secondary charged particle from each other,
    wherein an inspection is conducted on said contact hole on the basis of a signal from said detector.

5. The wafer inspection system using a charged particle beam according to claim 4, wherein said decelerator supplies a negative voltage.

6. The wafer inspection system using a charged particle beam according to claim 4, wherein said second deflector is an EXB type deflector.

7. A wafer inspection system using a charged particle beam, comprising:
    a sample stage for holding a sample;
    a first charged particle beam source for supplying a first charged particle beam to a sample having a hole pattern;

a second charged particle beam source for supplying a second charged particle beam;

a switch for making a switch between said first charged particle beam and said second charged particle beam to irradiate said sample having the hole pattern with the selected charged particle beam;

an objective lens for irradiating said sample irradiated with said first or second charged particle beam with a third charged particle beam; and a detector for detecting a fourth charged particle from said sample, wherein an inspection is conducted on said hole pattern on the basis of a signal from said detector.

8. A wafer inspection process using a charged particle beam, comprising:

a step of holding a wafer on which a pattern including a hole pattern is formed on a sample stage;

a step of charging the surface of said wafer placed on said sample stage and the side wall of said hole pattern formed on said wafer with a positive charged particle;

a deflecting step of scanning and irradiating said wafer with a primary charged particle beam;

a step of detecting a secondary charged particle from said wafer positively charged by a detector; and a step of determining whether said hole pattern is good or not on the basis of a signal from said detector.

9. The wafer inspection process using a charged particle beam according to claim 8, wherein as said charging step, a step of setting a voltage of the surface of said wafer to a range from 5 volts to 50 volts is included.

10. The wafer inspection process using a charged particle beam according to claim 8, wherein as said charging step, a step of controlling irradiation energy of said positive charged particle to a range from 100 electron volts to 1,000 electron volts is included.

11. A wafer inspection system using a charged particle beam, comprising:

a charged particle source;

an objective lens for irradiating a wafer on which a pattern including a hole pattern is formed with a primary charged particle beam from said charged particle source;

a sample stage for holding said wafer;

a charged particle generator for positively charging the surface of said wafer placed on said sample stage and the side wall of said hole pattern formed on said wafer;

a deflector for irradiating a predetermined area in said wafer positively charged with a primary charged particle beam;

a detector for detecting a secondary charged particle from said wafer positively charged; and an image processing unit for estimating a thickness of a residual film on the bottom of said hole pattern according to a contrast of an image of said secondary charged particle detected.

12. A wafer inspection process using a charged particle beam, comprising:

a step of holding a wafer on which a pattern including a hole pattern is formed on a sample stage;

a step of charging the surface of said wafer placed on said sample stage and the side wall of said hole pattern formed on said wafer with a positive charged particle;

a deflecting step of scanning and irradiating said wafer with a primary charged particle beam;

a step of detecting a secondary charged particle from said wafer positively charged by a detector; and a step of estimating a thickness of a residual film on the bottom of said hole pattern according to a contrast of an image of said secondary charged particle detected.

* * * * *